United States Patent
Sutardja et al.

(10) Patent No.: US 8,680,924 B2
(45) Date of Patent: Mar. 25, 2014

(54) DIFFERENTIAL POWER AMPLIFIERS WITH PUSH-PULL POWER AMPLIFIERS AND EVEN-HARMONIC CANCELLATION

(75) Inventors: Sehat Sutardja, Los Altos Hills, CA (US); Poh Boon Leong, Singapore (SG); Ping Song, Singapore (SG); Nuntha Kumar Krishnasamy Maniam, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 78 days.

(21) Appl. No.: 13/336,785

(22) Filed: Dec. 23, 2011

(65) Prior Publication Data

US 2012/0161871 A1 Jun. 28, 2012

Related U.S. Application Data

(60) Provisional application No. 61/426,991, filed on Dec. 23, 2010.

(51) Int. Cl.
  *H03F 3/26* (2006.01)
(52) U.S. Cl.
  USPC .......................................... 330/264; 330/276
(58) Field of Classification Search
  USPC ........................................ 330/264, 269, 276
  See application file for complete search history.

(56) References Cited

U.S. PATENT DOCUMENTS

| | | | |
|---|---|---|---|
| 3,571,742 A | 3/1971 | Wengenroth | |
| 6,087,900 A * | 7/2000 | Lee et al. | 330/264 |
| 6,448,847 B1 | 9/2002 | Paul et al. | |
| 8,134,408 B2 * | 3/2012 | Kawakami et al. | 330/276 |
| 8,378,750 B2 * | 2/2013 | Sutardja et al. | 330/264 |
| 2003/0011433 A1 | 1/2003 | Richley | |
| 2007/0176679 A1 | 8/2007 | Kluge | |
| 2008/0191784 A1 | 8/2008 | Khoury et al. | |
| 2009/0243722 A1 | 10/2009 | Liu et al. | |
| 2010/0238843 A1 | 9/2010 | Taghivand | |

OTHER PUBLICATIONS

International Search Report and Written Opinion from International Application No. PCT/US2011/067224 filed Dec. 23, 2011.

* cited by examiner

*Primary Examiner* — Steven J Mottola

(57) ABSTRACT

A differential power amplifier is provided and includes a first pair of transistors. A first transistor is inductively coupled to a voltage source and is connected to a node at a ground reference potential. A second transistor is inductively coupled to the node and is connected to the voltage source. Gates of the transistors are configured to receive an AC signal with a fundamental frequency. Drain of the first and second transistors are respectively first and second output nodes. The output nodes provide a first differential output. A capacitor is connected between the output nodes and provides a pathway for cancellation of even harmonic signals of the fundamental frequency. A second pair of transistors provides a second differential output. A first inductor is connected between the output nodes. A second inductor is connected between output nodes of the second pair of transistors. A combiner is inductively coupled to the inductors.

24 Claims, 3 Drawing Sheets

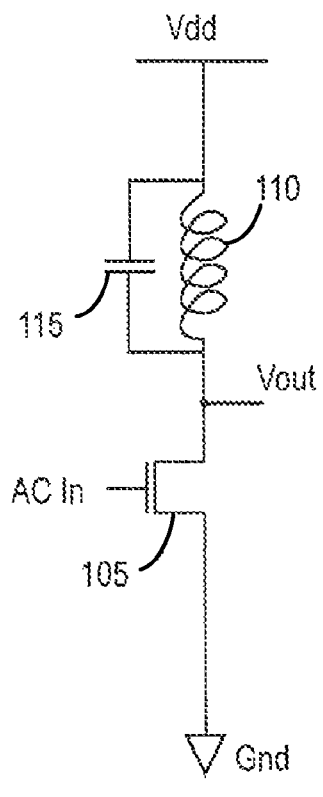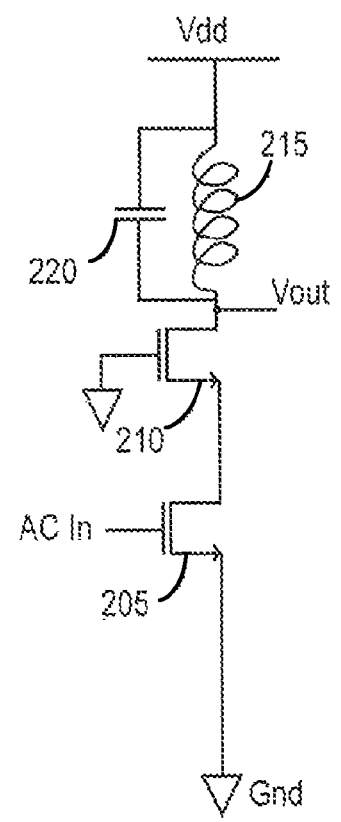
FIG. 1
Prior Art
FIG. 2
Prior Art

DIFFERENTIAL POWER AMPLIFIERS WITH PUSH-PULL POWER AMPLIFIERS AND EVEN-HARMONIC CANCELLATION

CROSS REFERENCE TO RELATED APPLICATIONS

This application claims the benefit of, and priority to, U.S. Provisional Patent App. No. 61/426,991, filed Dec. 23, 2010, titled "CMOS PUSH-PULL PA WITH EVEN HARMONIC CANCELLATION," of Sutardja et al., which is incorporated herein by reference in its entirety for all purposes.

BACKGROUND

Particular embodiments of the present invention generally relate to power amplifiers. More specifically, particular embodiments of the present invention relate to a power amplifier configured to cancel even harmonic signals.

Unless otherwise indicated herein, the approaches described in this section are not prior art to the claims in this application and are not admitted to be prior art by inclusion in this section.

Power amplifiers are configured to amplify the power of a received AC signal, such as an RF signal. Traditional power amplifiers often include a single nMOS transistor or a cascode both with tank loading. FIG. 1 is a simplified schematic of a traditional power amplifier 100 that includes an nMOS transistor 105 coupled between an inductor 110 and ground. Inductor 110 may be coupled to a voltage source Vdd. Inductor 110 may be coupled to a capacitor 115 in a tank configuration for tuning the resonance of power amplifier 100. The nMOS transistor 105 may be in a common source configuration with the gate of the nMOS transistor 105 configured to operate as an input to receive an AC signal and the drain coupled to the output Vout of power amplifier 100. FIG. 2 is a simplified schematic of another traditional power amplifier 200 that may include first and second nMOS transistors 205 and 210 in series between an inductor 215 and ground. Inductor 215 may be coupled to a voltage source Vdd. Inductor 215 may also be coupled to a capacitor 220 in a tank configuration for tuning the resonance of power amplifier 200. The nMOS transistors 205 and 210 may be in a common source, common gate configuration with the gate of nMOS transistor 205 configured to operate as an input to receive an AC signal and a drain of transistor 210 coupled to the output of power amplifier 200.

In traditional power amplifiers, such as power amplifier 100 and 200 described above, there are typically a number of nonlinear components at the drain of the transistor adjacent to the inductor. For example, the even harmonics, and especially the $2^{nd}$ harmonic, of a received AC signal tend to be fairly large at the drain of the transistor adjacent to the inductor. The averaging DC current from the even harmonics tends to be relatively large and flows in the inductor generating a relatively large amount of heat. As a result of the heat in the inductor, the inductance may change and in a worst case scenario the inductor may catastrophically fail.

Therefore, it would be desirable to provide new power amplifiers that are configured to reduce the nonlinear components and reduce the adverse effects of the nonlinear components in power amplifiers.

SUMMARY

Particular embodiments of the present invention generally relate to power amplifiers. More specifically, particular embodiments of the present invention relate to a power amplifier configured to cancel even harmonic signals.

According to one specific embodiment, a power amplifier includes a push-pull pair of transistors including a first transistor inductively coupled to a voltage source and coupled to a ground. A second transistor is inductively coupled to the ground and is coupled to the voltage source. Gates of the first and the second transistors are AC inputs configured to receive an AC signal having a fundamental frequency. Drain regions of the first and the second transistors are, respectively, first and second output nodes. The power amplifier further includes a capacitor coupled between the first output node and the second output node where the capacitor is configured as a pathway for cancellation of even harmonic signals of the fundamental frequency of the AC signal.

According to another specific embodiment, the power amplifier further includes a first inductor disposed between the first transistor and the voltage source. The first output node is between the first transistor and the first inductor. The power amplifier further includes a second inductor disposed between second transistor and the ground. The second output node is between the second transistor and the second inductor.

According to another specific embodiment, the first output node is between the drain of the first transistor and the first inductor, and the second output node is between the drain of the second transistor and the second inductor.

According to another specific embodiment, a source of the first transistor is coupled to the ground, and a source of the second transistor is coupled to the voltage source.

According to another specific embodiment, the first transistor and the second transistor are in a common source configuration.

According to another specific embodiment, the power amplifier further includes a first tank capacitor coupled in parallel with the first inductor and configured to tune the resonant frequency of a first inductor. The power amplifier further includes a second tank capacitor coupled in parallel with the second inductor and configured to tune the resonant frequency of a second inductor.

According to another specific embodiment, the capacitor is substantially not a pathway for cancellation of fundamental frequency of the AC signal.

According to another specific embodiment, the first output node and the second output node are the same output of the power amplifier and are configured to be combined by a combiner.

According to another embodiment, a power amplifier includes a first transistor, and a first inductor coupled in series with the first transistor between a voltage source and a ground. A first node between the first transistor and the first inductor is a first output. The power amplifier further includes a second transistor and a second inductor coupled in series with the second transistor between the voltage source and the ground. A second node between the second transistor and the second inductor is a second output. Gates of the first and the second transistors are AC inputs configured to receive an AC signal having a fundamental frequency. The power amplifier further includes a capacitor coupled between the first node and the second node and is configured as a pathway for cancellation of even harmonic signals of the fundamental frequency of the AC signal.

According to another embodiment, a fully-differential power amplifier includes first, second, third, and fourth transistor-inductor pairs each coupled in series between a voltage source and a ground. The fully-differential power amplifier further includes a first capacitor coupled between a first node, which is between the first transistor-inductor pair, and a second node, which is between the second transistor-inductor pair. The fully-differential power amplifier further includes a second capacitor coupled between a third node, which is between the third transistor-inductor pair, and a fourth node, which is between the fourth transistor-inductor pair. A first transistor of the first transistor-inductor pair is coupled to ground, and a first inductor of the first transistor-inductor pair is coupled to a voltage source. A second transistor of the second transistor-inductor pair is coupled to the voltage source, and a second inductor of the second transistor-inductor pair is coupled to the ground. A third transistor of the third transistor-inductor pair is coupled to ground, and a third inductor of the third transistor-inductor pair is coupled to a voltage source. A fourth transistor of the fourth transistor-inductor pair is coupled to the voltage source, and a fourth inductor of the fourth transistor-inductor pair is coupled to the ground. Gates of the first and the second transistors are plus input configured to receive an AC signal having a fundamental frequency, and gates of the third and the fourth transistors are minus input configured to receive the AC signal having the fundamental frequency. The first and second capacitors are configured to cancel even harmonics of the fundamental frequency of the AC signal.

According to one specific embodiment of the fully-differential power amplifier, the first and the third transistor are a first differential pair, and the second and fourth transistors are a second differential pair. Further, the first, second, third, and fourth transistors may be in a common source configuration.

According to another specific embodiment of the fully-differential power amplifier, the fully-differential power amplifier further includes a combiner having first, second, third, and fourth combiner inductors respectively in series. The first inductor and the first combiner inductor are inductively coupled. The third inductor and the second combiner inductor are inductively coupled. The fourth inductor and the third combiner inductor are inductively coupled. The second inductor and the fourth combiner inductor are inductively coupled.

According to another specific embodiment of the fully-differential power amplifier, the fully-differential power amplifier further includes a combiner having first and second combiner inductors in series. The first inductor, the second inductor, and the first combiner inductor are inductively coupled. The third inductor, the fourth inductor, and the second combiner inductor are inductively coupled.

The following detailed description and accompanying drawings provide a more detailed understanding of the nature and advantages of the present invention.

BRIEF DESCRIPTION OF THE DRAWINGS

FIG. 1 is a simplified schematic of a traditional power amplifier that includes an nMOS transistor coupled in series with an inductor between a voltage source and ground;

FIG. 2 is a simplified schematic of another traditional power amplifier that may include first and second nMOS transistors coupled in series with an inductor between a voltage source and ground;

DETAILED DESCRIPTION

Described herein are embodiments of a power amplifier and a method of operation for the power amplifier where the power amplifier is configured to cancel even harmonic signals present in the power amplifier.

In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Power amplifiers are configured to amplify the power of a received AC signal, such as an RF signal, for subsequent transmission of the amplified AC signal. Power amplifiers may be included in a variety of mobile devices, such as mobile telephones. A power-amplified AC signal may be directed through an antenna of a mobile device for transmission.

Figure 3:
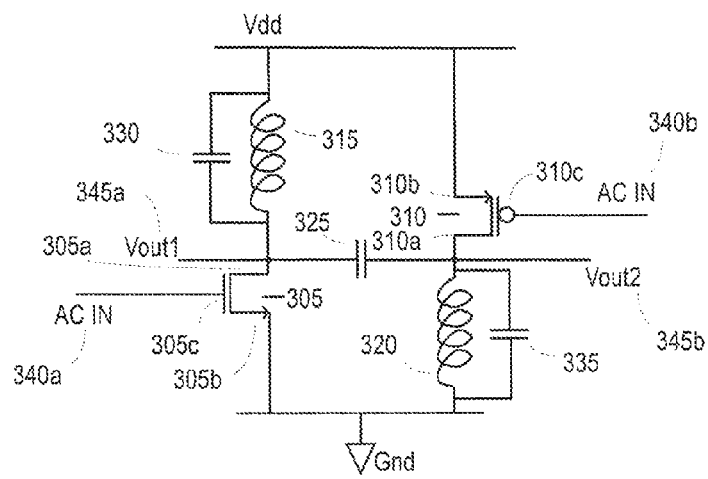
FIG. 3 is a simplified schematic of a power amplifier according to one embodiment of the present invention.

FIG. 3 is a simplified schematic of a power amplifier 300 according to one embodiment of the present invention. Power amplifier 300 includes a push-pull pair of transistors 305 and 310, (referred to as transistors 305 and 310). Power amplifier 300 further includes first and second inductors 315 and 320 and a capacitor 325. Power amplifier 300 may also include first and second tank capacitors 330 and 335. Transistors 305 and 310 may be metal-oxide-semiconductor field-effect transistors (MOSFETs), bipolar-junction transistors (BJTs), or other transistor types. For convenience, power amplifier embodiments are described herein as including MOSFETs. While power amplifier embodiments are described herein as including MOSFETs, it will be understood by those of skill in the art that BJTs or other types of transistors may be appropriately substituted for the MOSFETs, and these power amplifier embodiments that include BJTs or the like are considered to be within the scope and purview of the power amplifier embodiments of the present invention.

According to one embodiment, transistor 305 is an nMOS transistor with a drain 305a (sometimes referred to as a drain region) coupled to a first end of inductor 315 where a second end of inductor 315 is coupled to a voltage source Vdd. A source 305b of transistor 305 may be coupled to ground. Specific configurations of the sources and the drains of transistors 305 and 310 are described herein for convenience of explanation of specific embodiments. Alternative embodiments of the power amplifiers may include alternative configurations of the sources and the drains of transistors 305 and 310 as will be understood by those of skill in the art. A gate 305c of transistor 305 may be a first AC input 340a configured to receive an AC signal.

Capacitor 330 is coupled to inductor 315 in parallel in a tank configuration. Capacitor 330 is configured to tune the resonant frequency of inductor 315.

According to one embodiment, transistor 310 is a pMOS transistor with a drain 310a coupled to a first end of inductor 320 where a second end of inductor 320 is coupled to ground. A source 310b of transistor 310 is coupled to the voltage source Vdd. A gate 310c of transistor 310 may be a second AC input 340b configured to receive the AC signal supplied to the first AC input 340a. Capacitor 335 may be coupled to inductor 320 in parallel in a tank configuration. Capacitor 335 is configured to tune the resonant frequency of inductor 320. Inductors 315 and 320 may be considered the respective loads of the push-pull pair of transistors 305 and 310.

Power amplifier 300 includes a first output node 345a disposed between inductor 315 and the drain 305a of transistor 305. Power amplifier 300 further includes a second output node 345b disposed between inductor 320 and the drain 310a of transistor 310. According to one embodiment capacitor 325 is coupled between the first output node 345a and the second output node 345b.

The even harmonics (e.g., $2^{nd}$ harmonic, $4^{th}$ harmonic, etc.) of the AC signal that are at the drain of transistor 305 are generally 180 degrees out of phase with the even harmonics of the AC signal that are at the drain of transistor 310. The capacitance of capacitor 325 is determined such that the circuit path between the two output nodes is substantially a short circuit for the even harmonics, but is not a short circuit for the fundamental frequency of the AC signal. According to one specific embodiment, the capacitance of capacitor 325 is approximately 20 picofarads for an approximately 2 gigahertz AC signal. As the even harmonics on either side of capacitor 325 are out of 180 degrees phase and as capacitor 325 is substantially a short for the even harmonics on either side of capacitor 325, the even harmonics on either side of capacitor 325 tend to cancel each other. Because the even harmonics on either side of capacitor 325 tend to cancel each other, capacitor 325 ensures that the even harmonics do not substantially pass into the inductors 315 and 320. As a result, unnecessary heating of the inductors 315 and 320 via the even harmonics is inhibited. Capacitor 325 may be replaced with alternative circuits that provide capacitance, such as a diode or the like according to one alternative embodiment.

The voltage at the first output node 345a (i.e., the voltage at the drain of transistor 305) may be expressed as: $V_{dn} = \alpha_{0n} + \alpha_{1n}v(f_0) + \alpha_{2n}v(2f_0) + \alpha_{3n}v(3f_0) + \ldots$, and the voltage at the second output node 345b (i.e., the voltage at the drain of transistor 310) may be expressed as: $V_{dp} = \alpha_{0p} + \alpha_{1p}v(f_0) + \alpha_{2p}v(2f_0) + \alpha_{3p}v(3f_0) + \ldots$. The even coefficients of the voltage expressions for nMOS transistors and pMOS transistors have different polarities, providing for the substantial cancellation of the even harmonics across capacitor 325.

Power amplifier 300 is a single stage power amplifier that is not fully differential. Two power amplifiers 300 may be inductively coupled to form a fully-differential power amplifier according to one embodiment of the present invention.

Figure 4A:
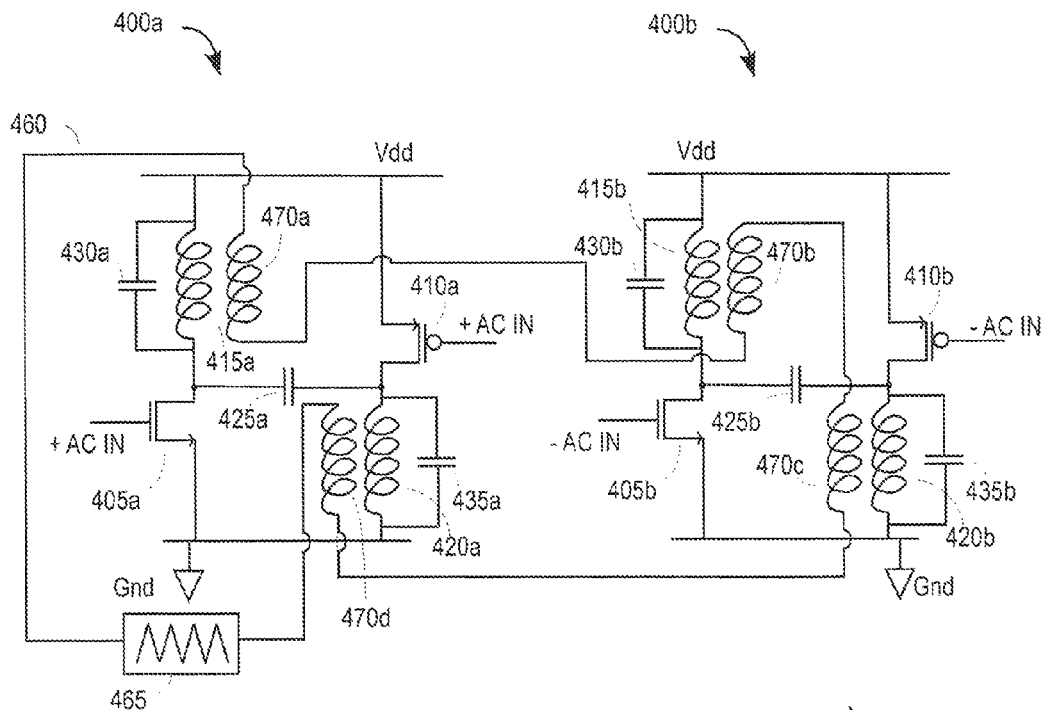
FIG. 4A is a simplified schematic of a fully-differential power amplifier according to one embodiment of the present invention.

FIG. 4A is a simplified schematic of a fully-differential power amplifier 400 according to one embodiment of the present invention. Fully-differential power amplifier 400 includes a first power amplifier 400a and a second power amplifier 400b. Power amplifiers 400a and 400b have substantially the same configuration as power amplifier 300 described above. Power amplifiers 400a and 400b are both configured to cancel the even harmonics of the fundamental frequency of a received AC signal. The numbering scheme of the power amplifiers used with respect to fully-differential power amplifier 400 is changed for convenience as fully-differential power 400 includes first and second stages where each stage includes a power amplifier 300.

Power amplifier 400a includes a push-pull pair of transistors 405a and 410a, which are referred to herein as transistors 405a and 410a. Power amplifier 400a further includes first and second inductors 415a and 420a and a capacitor 425a. Power amplifier 400 may also include first and second tank capacitors 430a and 435a. Transistors 405a and 410a are MOSFETs, BJTs, or other transistors types. According to one embodiment, transistor 405a is an nMOS transistor, and transistor 410a is a pMOS transistor. The electronic components of power amplifier 400a are configured substantially the same as the corresponding electronic components of power amplifier 300. For example, transistor 405a may be in a common source configuration and coupled in series with inductor 415a. The series pair of transistor 405a and inductor 415a are coupled between the voltage source Vdd and the ground where transistor 405a is coupled to the ground and inductor 415a is coupled to the voltage source Vdd. Transistor 410a is similarly in a common source configuration and is coupled in series with inductor 420a. The series pair of transistor 410a and inductor 420a are coupled between the voltage source Vdd and the ground with transistor 410a coupled to the voltage source Vdd and inductor 420a coupled to the ground.

Power amplifier 400b includes a push-pull pair of transistors 405b and 410b, which are referred to herein as transistors 405b and 410b. Power amplifier 400b further includes first and second inductors 415b and 420b and a capacitor 425b. Power amplifier 400 may also include first and second tank capacitors 430b and 435b. Transistors 405b and 410b may be MOSFETs, BJTs, or other transistor types. According to one embodiment, transistor 405b is an nMOS transistor, and transistor 410b is a pMOS transistor. The electronic components of power amplifier 400a are configured substantially the same as the corresponding electronic components of power amplifier 300. For example, transistor 405b may be in a common source configuration and coupled in series with inductor 415b. The series pair of transistor 405b and inductor 415b are coupled between the voltage source Vdd and the ground where transistor 405b is coupled to the ground and inductor 415b is coupled to the voltage source Vdd. Transistor 410b is similarly in a common source configuration and is coupled in series with inductor 420b. The series pair of transistor 410b and inductor 420b are between the voltage source Vdd and the ground with transistor 410b coupled to the voltage source Vdd and inductor 420b coupled to the ground.

The first and second output nodes of power amplifier 400a are coupled by capacitor 425a. The first and second output nodes of power amplifier 400b are coupled by capacitor 425b. Capacitor 425a is configured to provide a circuit path for the cancellation of even harmonics on opposite sides of capacitor 425a. Similarly, capacitor 425b is configured to provide a circuit path for the cancellation of even harmonics on opposite sides of capacitor 425b.

The gates of transistors 405a and 410a are the AC inputs for power amplifier 400a and are the "plus" inputs of fully-differential power amplifier 400. The gates of transistors 405b and 410b are the AC inputs for power amplifier 400b and are the "minus" inputs of fully-differential power amplifier 400. The plus inputs of the fully-differential power amplifier are designated with "+" symbols in FIG. 4A, and the minus inputs are designated with "−" symbols in FIG. 4A. The nMOS transistors 405a and 405b are a fully differential n-pair and the pMOS transistors 410a and 410b are a fully differential p-pair.

According to one embodiment of the present invention, a combiner 460 is configured to combine the outputs of fully-differential power amplifier 400 to deliver an amplified AC signal to an antenna 465 or the like. Combiner 460 includes a first, second, third, and fourth inductors 470a, 470b, 470c, and 470d coupled together in series and coupled to antenna 465. Inductors 470a, 470b, 470c, and 470d are inductively coupled, respectively, to inductors 415a, 420a, 415b, and 420b where each pair of inductively coupled inductors is a transformer.

Figure 4B:
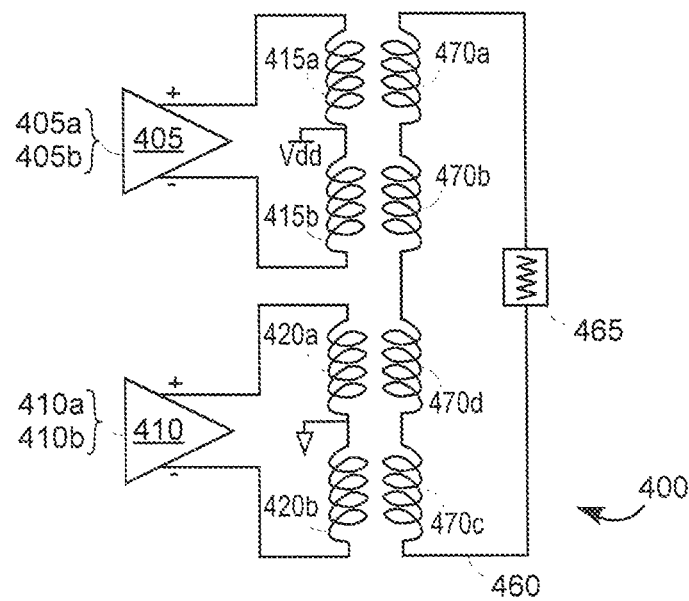
FIG. 4B is an alternative simplified schematic of the fully-differential power amplifier shown in FIG. 4A.

FIG. 4B is an alternative simplified schematic of the fully-differential power amplifier 400 shown in FIG. 4A. Transistors 405a and 405b are shown as a driver 405 with positive and negative differential outputs, and transistors 410a and 410b are shown as a driver 410 also with positive and negative differential outputs. The fully-differential power amplifier 400 as shown in FIG. 4B clearly shows the serial nature of the first, the second, the third, and the fourth inductors 470a, 470b, 470c, and 470d. As shown in FIG. 4B, the laterally adjacent inductors 415a and 470a are inductively coupled, the laterally adjacent inductors 415b and 470b are inductively coupled, the laterally adjacent inductors 420a and 470d are inductively coupled, and the laterally adjacent inductors 420b and 470c are inductively coupled. The node between inductors 415a and 415b may be coupled to a reference voltage, such as Vdd. The node between inductors 420a and 420b may be coupled to ground.

Figure 5:
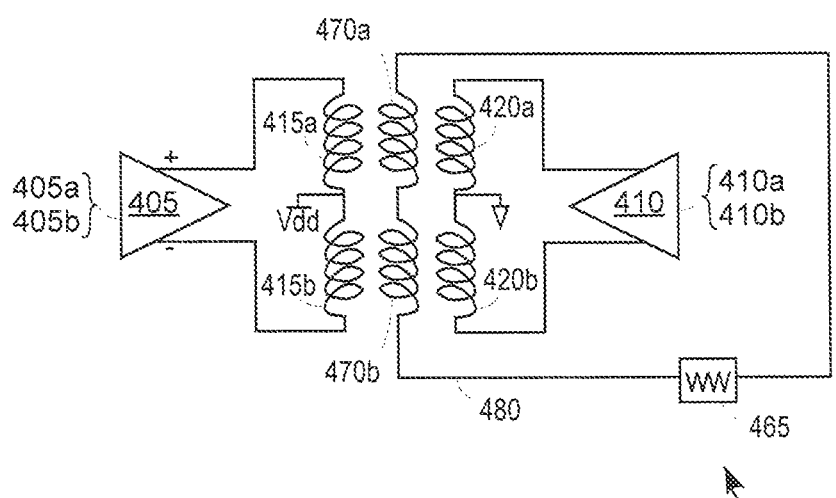
FIG. 5 is a simplified schematic of a fully-differential power amplifier according to an alternative embodiment.

FIG. 5 is a simplified schematic of a fully-differential power amplifier 500 according to an alternative embodiment. The same reference numeral schema used for the foregoing described figures is used in FIG. 5 to identify the same elements or substantially similar elements. Fully-differential power amplifier 500 is substantially similar to fully-differential power amplifier 400 but differs in that a combiner 480 of fully-differential power amplifier 500 differs from combiner 460 of fully-differential power amplifier 400. Combiner 480 includes the first inductor 470a inductively coupled to both inductors 415a and 420a, and the second inductor 470b inductively coupled to both inductors 415b and 420b. Inductors 470a and 470b are disposed in series. Inductors 470a, 415a, and 420a are substantially parallel, and inductors 470b, 415b, and 420b are also substantially parallel. Combiner 480 then applies the outputs onto antenna 465.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations, and equivalents may be employed without departing from the scope of the invention as defined by the claims.

What is claimed is:

1. A differential power amplifier comprising:
   a first push-pull pair of transistors comprising
      a first transistor inductively coupled to a voltage source and connected to a node, wherein the node is at a ground reference potential,
      a second transistor (i) inductively coupled to the node at the ground reference potential, and (ii) connected to the voltage source,
      wherein
         a gate of the first transistor and a gate of the second transistor are configured to receive an alternating current (AC) signal,
         the alternating current (AC) has a fundamental frequency,
         a drain of the first transistor is a first output node, and a drain of the second transistor is a second output node
         the first output node and the second output node provide a first differential output;
   a first capacitor connected between the first output node and the second output node, wherein the first capacitor provides a pathway for cancellation of even harmonic signals of the fundamental frequency of the alternating current (AC) signal;
   a second push-pull pair of transistors providing a second differential output;
   a first inductor connected between the first output node and the second output node;
   a second inductor connected between output nodes of the second push-pull pair of transistors; and
   a combiner inductively coupled to the first inductor and the second inductor.

2. The differential power amplifier of claim 1, further comprising:
   a first inductor connected between the first transistor and the voltage source, wherein the first output node is connected between the first transistor and the first inductor; and
   a second inductor connected between second transistor and the node at the ground reference potential, wherein the second output node is connected between the second transistor and the second inductor.

3. The differential power amplifier of claim 2, wherein:
   the first output node is connected between the drain of the first transistor and the first inductor; and
   the second output node is connected between the drain of the second transistor and the second inductor.

4. The differential power amplifier of claim 2, wherein:
   a source of the first transistor is connected to the node at the ground reference potential; and
   a source of the second transistor is connected to the voltage source.

5. The differential power amplifier of claim 1, wherein the first transistor and the second transistor are in a common source configuration.

6. The differential power amplifier of claim 2, further comprising:
   a second capacitor connected in parallel with the first inductor, wherein the second capacitor is configured to tune a resonant frequency of the first inductor; and
   a third capacitor connected in parallel with the second inductor, wherein the third capacitor is configured to tune a resonant frequency of the second inductor.

7. The differential power amplifier of claim 1, wherein the first capacitor is not a pathway for cancellation for the fundamental frequency of the alternating current (AC) signal.

8. A differential power amplifier comprising:
   a first transistor;
   a first inductor connected in series with the first transistor, wherein the first inductor is connected between a voltage source and a node, wherein the node is at a ground reference potential, and wherein a first output node is connected between the first transistor and the first inductor;
   a second transistor, wherein the first transistor and the second transistor provide a first differential output;
   a second inductor connected in series with the second transistor, wherein
      the second inductor is connected between the voltage source and the node at the ground reference potential,
      a second output node is connected between the second transistor and the second inductor, and
      a gate of the first transistor and a gate of the second transistor are configured to receive an alternating current (AC) signal, and
      the alternating current (AC) signal has a fundamental frequency;
   a first capacitor connected between the first output node and the second output node, wherein the first capacitor provides a pathway for cancellation of even harmonic signals of the fundamental frequency of the alternating current (AC) signal;
   a third transistor having a third output node;

a fourth transistor having a fourth output node, wherein the third transistor and the fourth transistor provide a second differential output;
a third inductor connected between the first output node and the second output node;
a fourth inductor connected between the third output node and the fourth output node; and
a combiner inductively coupled to the first inductor and the second inductor.

9. The differential power amplifier of claim 8, wherein:
the first transistor and the second inductor are connected to the node at the ground reference potential; and
the second transistor and the first inductor are connected to the voltage source.

10. The differential power amplifier of claim 9, wherein:
a source of the first transistor is connected to the node at the ground reference potential; and
a source of the second transistor is connected to the voltage source.

11. The differential power amplifier of claim 10, wherein:
a drain of the first transistor is connected to the first inductor; and
a drain of the second transistor is connected to the second inductor.

12. The differential power amplifier of claim 11, wherein:
the first output node is connected between the drain of the first transistor and the first inductor; and
the second output node is connected between the drain of the second transistor and the second inductor.

13. The differential power amplifier of claim 8, further comprising:
a second capacitor connected in parallel with the first inductor, wherein the second capacitor is configured to tune a resonant frequency of the first inductor; and
a third capacitor connected in parallel with the second inductor, wherein the third capacitor is configured to tune a resonant frequency of the second inductor.

14. The differential power amplifier of claim 8, wherein the first transistor and the second transistor are in a common source configuration.

15. The differential power amplifier of claim 8, wherein the first capacitor is not a pathway for cancellation for the alternating current (AC) signal.

16. A differential power amplifier comprising:
a first transistor-inductor pair, a second transistor-inductor pair, a third transistor-inductor pair, and a fourth transistor-inductor pair, wherein each of the first transistor-inductor pair, the second transistor-inductor pair, the third transistor-inductor pair, and the fourth transistor-inductor pair is coupled in series between a voltage source and a ground;
a first capacitor coupled between a first node, which is between a first transistor and a first inductor of the first transistor-inductor pair, and a second node, which is between a second transistor and a second inductor of the second transistor-inductor pair; and
a second capacitor coupled between a third node, which is between a third transistor and a third inductor of the third transistor-inductor pair, and a fourth node, which is between a fourth transistor and a fourth inductor of the fourth transistor-inductor pair, wherein
the first transistor of the first transistor-inductor pair is coupled to the ground,
the first inductor of the first transistor-inductor pair is coupled to the voltage source,
the second transistor of the second transistor-inductor pair is coupled to the voltage source,
the second inductor of the second transistor-inductor pair is coupled to the ground,
the third transistor of the third transistor-inductor pair is coupled to the ground,
the third inductor of the third transistor-inductor pair is coupled to the voltage source,
the fourth transistor of the fourth transistor-inductor pair is coupled to the voltage source,
the fourth inductor of the fourth transistor-inductor pair is coupled to the ground,
a gate of the first transistor and a gate of the second transistor are positive inputs configured to receive an alternating current (AC) signal having a fundamental frequency,
a gate of the third transistor and a gate of the fourth transistor are negative inputs configured to receive the alternating current (AC) signal having the fundamental frequency, and
the first capacitor and the second capacitor are configured to cancel even harmonics of the fundamental frequency of the alternating current (AC) signal.

17. The differential power amplifier of claim 16, wherein:
the first transistor and the third transistor are a first differential pair; and
the second transistor and the fourth transistor are a second differential pair.

18. The differential power amplifier of claim 16, wherein the first transistor, the second transistor, the third transistor, and the fourth transistor are in a common source configuration.

19. The differential power amplifier of claim 16, further comprising a combiner having a first inductor, a second inductor, a third inductor, and a fourth inductor connected in series, wherein:
the first inductor of the first transistor-inductor pair and the first inductor of the combiner are inductively coupled;
the third inductor of the third transistor-inductor pair and the second inductor of the combiner are inductively coupled;
the fourth inductor of the fourth transistor-inductor pair and the third inductor of the combiner are inductively coupled; and
the second inductor of the second transistor-inductor pair and the fourth inductor of the combiner are inductively coupled.

20. The differential power amplifier of claim 16, further comprising a combiner having a first inductor and a second inductor, wherein:
the first inductor of the combiner and the second inductor of the combiner are connected in series;
the first inductor of the first transistor-inductor pair, the second inductor of the second transistor-inductor pair, and the first inductor of the combiner are inductively coupled; and
the third inductor of the third transistor-inductor pair, the fourth inductor of the fourth transistor-inductor pair, and the second inductor of the combiner are inductively coupled.

21. The differential power amplifier of claim 1, wherein the combiner comprises:
a third inductor inductively coupled to the first inductor; and
a fourth inductor connected in series with the third inductor, wherein the fourth inductor is inductively coupled to the second inductor.

22. The differential power amplifier of claim 21, further comprising:
a fifth inductor connected in series with the first inductor; and
a sixth inductor connected in series with the second inductor,
wherein the combiner comprises:
a seventh inductor inductively coupled to the fifth inductor, and
an eighth inductor inductively coupled to the sixth inductor.

23. The differential power amplifier of claim 1, wherein the combiner comprises a third inductor inductively coupled to the first inductor and the second inductor.

24. The differential power amplifier of claim 23, further comprising:
a fourth inductor connected in series with the first inductor; and
a fifth inductor connected in series with the second inductor,
wherein
the combiner comprises a sixth inductor connected in series with the third inductor, and
the sixth inductor is inductively coupled to the fourth inductor and the fifth inductor.

* * * * *